(12) United States Patent
Che et al.

(10) Patent No.: US 10,957,566 B2
(45) Date of Patent: Mar. 23, 2021

(54) WAFER-LEVEL INSPECTION USING ON-VALVE INSPECTION DETECTORS

(71) Applicant: Taiwan Semiconductor Manufacturing Co., Ltd., Hsin-Chu (TW)

(72) Inventors: Mu-Lung Che, Hsin-Chu (TW); Fu Chiang Hsu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 15/951,578

(22) Filed: Apr. 12, 2018

(65) Prior Publication Data

US 2019/0318948 A1    Oct. 17, 2019

(51) Int. Cl.
*H01L 21/67* (2006.01)
*G06T 7/00* (2017.01)
*H01L 21/677* (2006.01)

(52) U.S. Cl.
CPC ........ *H01L 21/67288* (2013.01); *G06T 7/001* (2013.01); *H01L 21/67742* (2013.01); *G06T 2207/30148* (2013.01)

(58) Field of Classification Search
CPC ......... H01L 21/67288; H01L 21/67276; H01L 21/67742; H01L 21/67253; H01L 21/67259; H01L 21/67265; H01L 21/67271; H01L 22/00; H01L 22/20; H01L 22/30; G06T 7/001; G06T 2207/30108; G06T 2207/30121; G06T 2207/30141; G06T 2207/30148; G06T 2207/30152; G06T 2207/30168
USPC ................................ 382/141, 145–152, 100
See application file for complete search history.

(56) References Cited

U.S. PATENT DOCUMENTS

| 2002/0037655 | A1* | 3/2002 | Hasunuma | ........ H01L 21/67017 438/778 |
| 2002/0181757 | A1* | 12/2002 | Takeuchi | ................ G06T 7/001 382/149 |
| 2004/0262548 | A1* | 12/2004 | Komatsu | ........... H01L 21/67265 250/559.4 |
| 2005/0117796 | A1* | 6/2005 | Matsui | ............. G01N 21/95607 382/145 |
| 2006/0046396 | A1* | 3/2006 | Harless | ............. H01L 21/68728 438/270 |
| 2007/0135933 | A1* | 6/2007 | Panesse | ................. B25J 9/1671 700/17 |

(Continued)

*Primary Examiner* — Dwayne D Bost
*Assistant Examiner* — Stephen M Brinich
(74) *Attorney, Agent, or Firm* — Duane Morris LLP

(57) ABSTRACT

A system and method for wafer-level inspection using on-valve inspection detectors to detect defects on a semiconductor wafer surfaces during a semiconductor device manufacturing process is disclosed herein. In some exemplary embodiments, a method for wafer-level inspection includes: transporting a semiconductor wafer through a transfer port of a processing chamber; scanning a surface of the semiconductor wafer automatically using at least one on-valve inspection detector arranged on a vacuum valve providing access through the transfer port; generating at least one surface image of the surface of the semiconductor wafer; and analyzing the at least one surface image to detect defects on the surface of the semiconductor wafer.

20 Claims, 9 Drawing Sheets

(56) References Cited

U.S. PATENT DOCUMENTS

| | | | |
|---|---|---|---|
| 2007/0237385 A1* | 10/2007 | Kato | G01N 21/9501 |
| | | | 382/149 |
| 2009/0080761 A1* | 3/2009 | Barker | G06K 7/10594 |
| | | | 382/145 |
| 2009/0161094 A1* | 6/2009 | Watkins | G06T 7/0004 |
| | | | 356/237.2 |
| 2010/0026997 A1* | 2/2010 | Hayashi | G01B 11/24 |
| | | | 356/237.5 |
| 2010/0177953 A1* | 7/2010 | Hayashi | G01B 11/08 |
| | | | 382/145 |
| 2015/0010379 A1* | 1/2015 | Sharrock | H01L 21/67259 |
| | | | 414/292 |

* cited by examiner

WAFER-LEVEL INSPECTION USING ON-VALVE INSPECTION DETECTORS

BACKGROUND

In the semiconductor integrated circuit (IC) industry, there is a continuing demand for smaller device dimensions and higher circuit packing densities. This demand has driven the semiconductor industry to develop new materials and complex processes. Manufacturing an IC at such dimensions and complexity generally uses advanced techniques to inspect the IC at various stages of the manufacturing process for quality control purposes.

For example, when a feature (e.g., a gate/drain/source feature of a transistor, a horizontal interconnect line, or a vertical via, etc.) is to be formed on a wafer, the wafer typically goes through a production line which comprises multiple processing stations typically using different process tools to perform various operations such as cleaning, photolithography, dielectric deposition, dry/wet etching, and metal deposition, for example. Prior to being transferred to a next step (e.g., a next processing station) in the production line, the wafer is typically inspected for defects.

In general, such an inspection is manually performed by a human using an optical instrument to determine the presence of defect(s) such as, parametric (e.g., line width), random (e.g., individual via), and area-dependent failures (e.g., "killer defect" particles) that may be caused by one or more malfunctioning processing stations along the production line. This manual inspection typically relies on sampling a certain amount of positions on surfaces of a certain amount of wafers randomly selected from a box of wafers, which is typically known as an "offline inspection." Such an offline inspection disadvantageously causes various issues.

For example, a time-resource trade-off leads to a trade-off between an inspection resolution and a sampling rate, e.g., a high sampling rate (i.e., a high throughput of the inspection) is typically subjected to a low inspection resolution, and vice versa. Further, because of the "manual" operation, such an offline inspection often interrupts an automatic production line, which also increases the possibility of wafer contamination.

Therefore, in contrast to the offline inspection, an "inline" inspection that can automatically detect defects can provide critical insights into a wide variety of process characteristics (e.g., tools and conditions) without significantly interrupting the production line or affecting its throughput has been desired by the IC industry. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of an inline inspection system that comprises a plurality of on-valve inspection detectors. In some embodiments, such an on-valve inspection detectors can be integrated on a vacuum valve attached to a transfer port of a processing chamber. Moreover, in contrast to sampling only a few locations on the wafer for inspection and/or a few wafers from a cassette of wafers, the plurality of on-valve inspection detectors scan a front and a back surfaces of a semiconductor wafer that are being transferred through the transfer port. Both surfaces are scanned in a line-by-line fashion during such wafer transferring process to determine whether a defect is present. As such, in contrast to conventional offline manual inspection processes, such inline inspection processes provide high throughput without compromising a high inspection resolution (i.e., no trade-off between the sampling rate and the inspection resolution). Accordingly, the above-mentioned issues in the conventional offline inspection system may be advantageously avoided.

Figure 1:
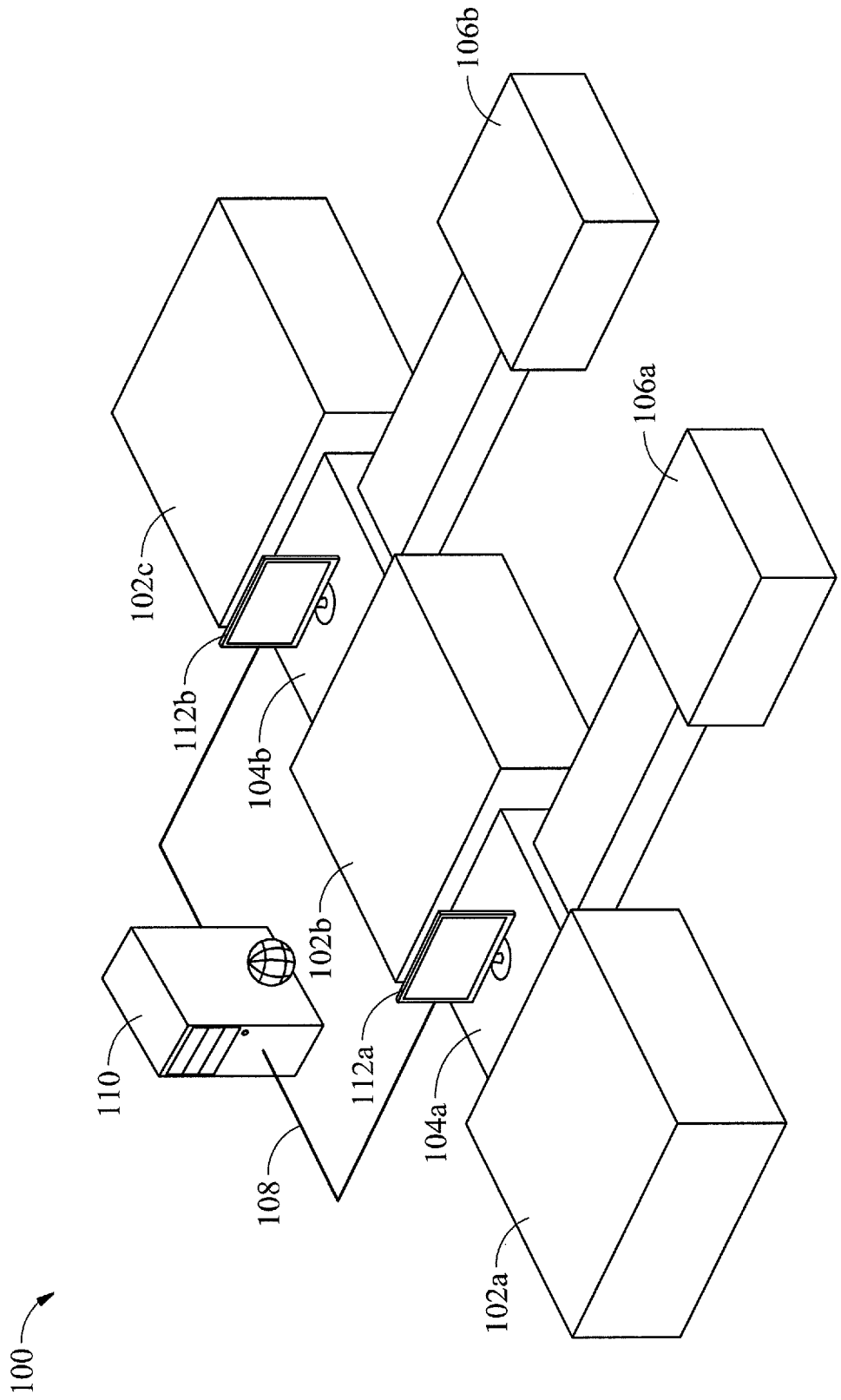
FIG. 1 illustrates a block diagram of a system integrated with on-valve inspection detectors in a semiconductor manufacturing production line, in accordance with some embodiments of the present disclosure.

FIG. 1 illustrates a block diagram of a system 100 integrated with on-valve inspection detectors in a semiconductor manufacturing production line, in accordance with some embodiments of the present disclosure. It is noted that the system 100 is merely an example, and is not intended to limit the present disclosure. Accordingly, it is understood that additional operations may be provided before, during, and after the system 100 of FIG. 1, and that some other operations may only be briefly described herein.

Referring to FIG. 1, the system 100 comprises a plurality of processing stations 102*a*, 102*b* and up to 102*c* (collectively referred to as processing station(s) 102 herein), a plurality of connecting chambers 104a and 104b (collectively referred to as connecting chamber(s) 104 herein) located between respective processing stations 102, and a plurality of storage stations 106a and 106b (collectively referred to has storage station(s) 106 herein) coupled to respective connecting chambers 104. Examples of IC manufacturing processes conducted in processing stations 102 include cleaning, photolithography, wet etching, dry etching, dielectric deposition, metal deposition, and any processes known in the art. At least one feature can be created in each processing station 102 including a metal contact, an etch trench, an isolation, a via, an interconnect line and the like.

Vacuum valves between the processing stations 102 and connecting chambers 104 can be equipped with on-valve inspection detectors, which are used to inspect wafers from the respective processing station 102 before it is transported to the next processing station 102 or to a storage station 106, as discussed in further detail in FIGS. 2 and 3. For example, a processing station 102b is coupled to a prior processing station 102a through a connection chamber 104a and is also coupled to a later processing station 102c through a connecting chamber 104b. At least one storage station 106 is coupled to each connecting chamber 104. For example, a storage station 106a is coupled to the connecting chamber 104a, in which a wafer with defects as determined by the on-valve inspection detectors on the processing station 102a can be extracted from the production line and stored in the storage station 106a for reprocessing or rejection, instead of being transferred to the next processing station 102b.

As discussed in further detail below, in some embodiments, the connecting chamber 104 includes a transfer mechanism that transfers a wafer from the processing station 102 through the connecting chamber 104, and a local computer 112 with a storage unit and a display unit. For example, the wafer can be transferred on a transfer mechanism in the connecting chamber 104a from processing station 102a to processing station 102b, or if a defect is detected to respective storage station 106a. While being transferred from the processing station 102a to the connecting chamber 104a, both front and back surfaces of the wafer is imaged by the plurality of on-valve inspection detectors. Data collected by the plurality of on-valve inspection detectors can be stored in a storage unit of a local computer 112a followed by a preprocessing step. Examples of preprocessing can include a reconstruction of the pixel line images into a plurality of two-dimensional surface images of the wafer and various distortion corrections, as described in further detail below. As shown in FIG. 1, a second local computer 112b is coupled to the second connecting chamber 104b to store and preprocess data collected by the on-valve inspection detectors equipped on the vacuum valve of the processing station 102b.

Each of the local computers 112a and 112b are generally or collectively referred to local computer(s) 112 herein. The local computers 112 are each coupled to a remote computer 110 through a connection 108. In some embodiments, the connection 108 may include an Ethernet cable, an optical fiber, a wireless communication media, and/or other networks known in the art. It should be understood that other connections and intermediate circuits can be deployed between the local computers 112 and the remote computer 110 to facilitate interconnection.

In some embodiments, an image processing operation can be performed by the remote computer 110 to automatically compare design criteria with the collected surface images of the wafer according to predefined algorithms or rules concerning, e.g., line width, irregular shape, nonuniformity, and the like. In some embodiments, the remote computer 110 includes a computer network, servers, applications, and/or data centers, generally known as the "cloud" or cloud computing. Results and decisions from the remote computer 110 about whether the wafer contains defects are processed and transmitted back to the local computer 112 associated with the connecting chamber 104 and thus the processing station 102 with the on-valve inspection detectors on the vacuum valve through the connection 108. In some embodiments, the remote computer 110 may be unnecessary if the local computer 112 can perform the image processing and analysis locally. In some embodiments, various inspection results (e.g., size, density and distribution of defects and mapping of defects overlaid with design patterns) are displayed on a local display unit and, if the wafer is determined to be defective, a control signal is sent to the transfer mechanism to transfer the wafer to a respective storage station 106. In some embodiments, a wafer that fails to meet a pre-defined threshold or criterion, and thus determined to be defective, is transferred by the transfer mechanism through the connection chamber 104a to a cassette in the storage station 106a for reprocessing or rejection. On the other hand, if the wafer is determined to be not defective meeting the pre-defined threshold or criterion, then it is transferred by the transfer mechanism to the next processing station 102b for further processing. In some embodiments, the threshold may vary depending on the application and can be set by manufacturers. In some embodiments, the transfer mechanism in the connecting chamber 104 transfers all the wafers to a storage station before they are processed in a following processing station 102.

Although the system 100 in the illustrated embodiment of FIG. 1 includes only three processing stations 102, two connecting chambers 104, two storage stations 106, two local computers 112 and one remote computer 110, it is understood that the illustrated embodiment of FIG. 1 is merely provided for illustration purposes. The system 100 may include any desired number of processing stations 102, inspection systems 104, storage stations 106, and computers 110/112 while remaining within the scope of the present disclosure. Furthermore, in some embodiments, a connecting chamber 104 can be coupled to two or more processing stations 102 and/or two or more storage stations 106.

In some embodiments, the connecting chamber 104 can maintain a vacuum seal between two processing stations with vacuum process chambers or purged with high purity inert gas (e.g., Ar and $N_2$) to provide an inert atmosphere for air sensitive wafers during the transferring process. In some embodiments, the on-valve inspection detectors may be configured inside the vacuum door of the processing station 102, if the process does not interfere with the inspection. Such an integration of on-valve inspection detectors to an existing semiconductor processing stations provides an inline inspection that can efficiently detect and map the defects of both front and back surfaces of a wafer, without relying on manual inspection or statistical sampling of the wafer surfaces using additional inspection stations. By mapping the defects of the wafer after each processing stage, as part of the inline manufacturing process, critical insights into process characteristics (e.g., tools and conditions) of each stage can be obtained while minimizing adverse effects on throughput.

Figure 2A:
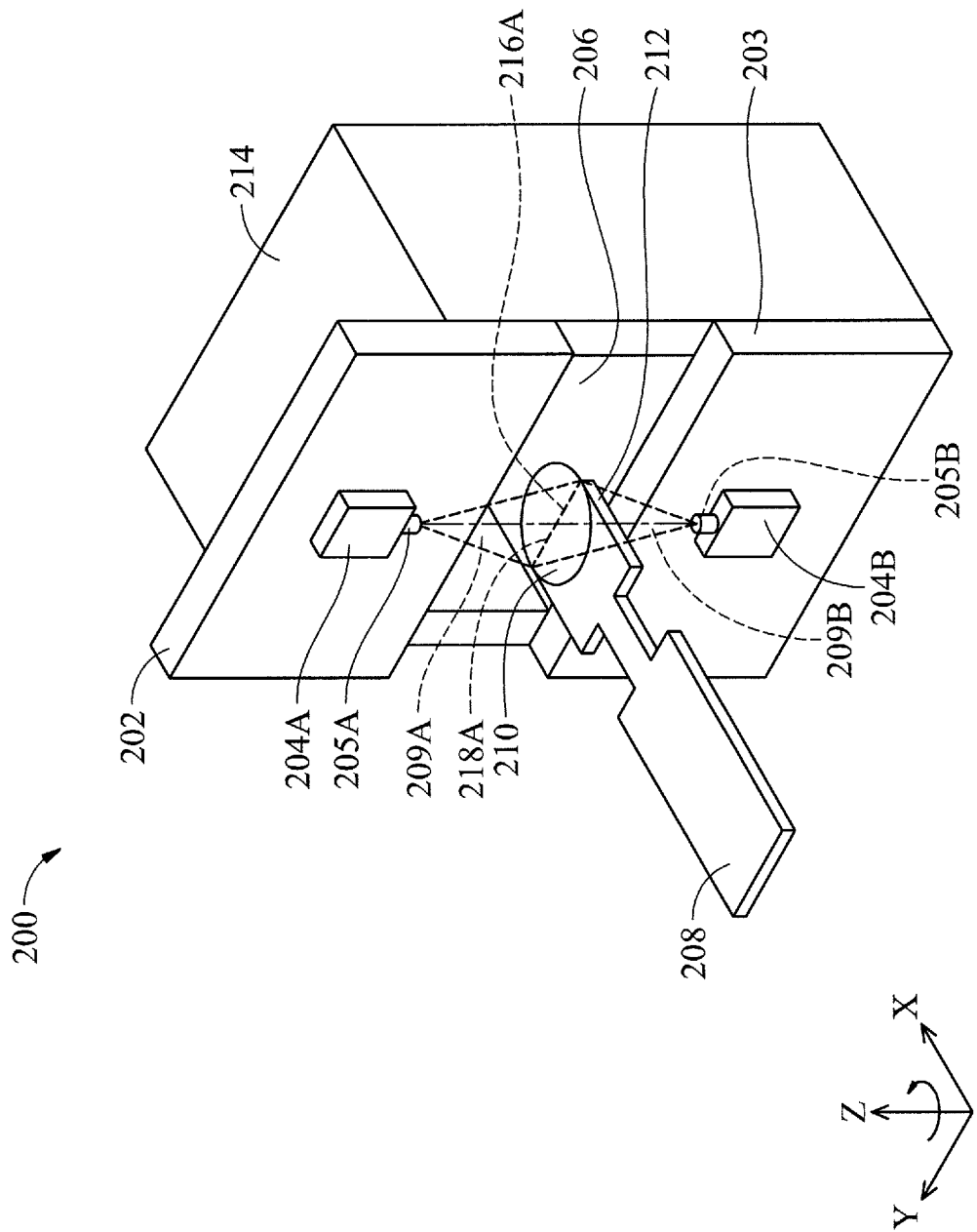
FIG. 2A illustrates a perspective view of a vacuum processing chamber with two on-valve inspection detectors, in accordance with some embodiments of the present disclosure.
Figure 2B:
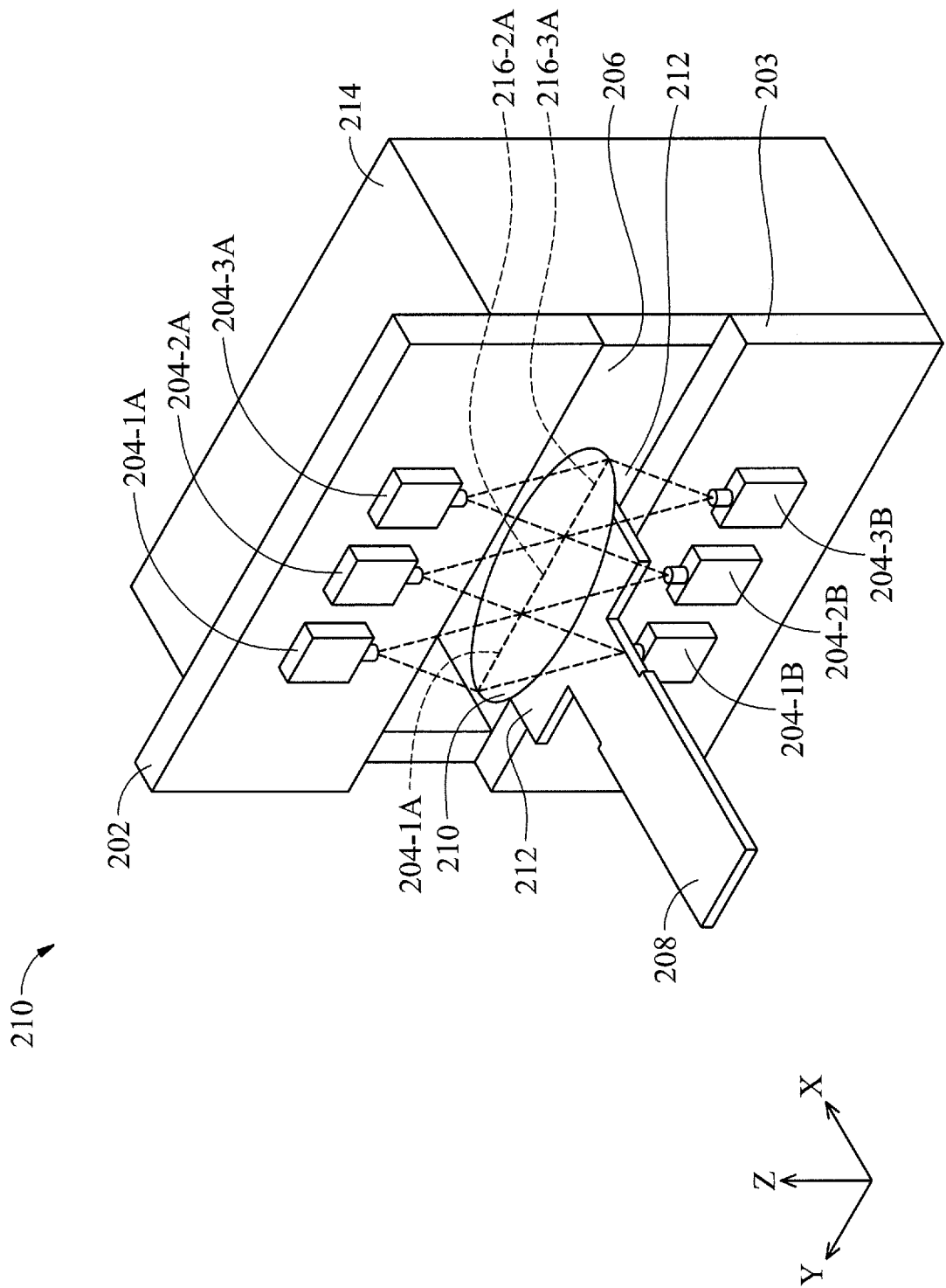
FIG. 2B illustrates a perspective view of a vacuum processing chamber with six on-valve inspection detectors, in accordance with some embodiments of the present disclosure.

FIGS. 2A-2B illustrate a variety of perspective views of vacuum processing chambers in processing stations with on-valve inspection detectors attached to vacuum valves considering various space requirement and wafer size, in accordance with some embodiments of the present disclosure. These are, of course, merely examples and are not intended to be limiting.

FIG. 2A illustrates a perspective view of a vacuum processing chamber 214 with two on-valve inspection detectors 204A, 204B, in accordance with some embodiments of the present disclosure. In one embodiment, a wafer 210 is secured by a suitable wafer holder 212 coupled to a transfer mechanism 208, e.g., a motorized robotic transfer arm. In some embodiments, the wafer holder 212 secures the wafer 210 while exposing the front and back surfaces of the wafer for inspection. The transfer mechanism 208 is translatable in both the X and Y directions. In some embodiments, the transfer mechanism 208 is also rotatable about a certain center in the X-Y plane. In the illustrated embodiment, the wafer holder 212 coupled to the transfer mechanism 208 transfers the wafer 210 along the X axis at a constant speed when exiting a vacuum processing chamber 214 through a transfer port 206.

In the embodiment shown in FIG. 2A, two on-valve inspection detectors 204A and 204B (collectively on-valve inspection detector(s) 204) with imaging lenses 205A and 205B, respectively, are mounted on a vacuum valve. In some embodiments, the vacuum valve comprises a movable vacuum valve door 202 and a stationary vacuum valve base 203. The on-valve inspection detectors 204A and 204B are located at respective working distances 209A and 209B from each of the front and back surfaces of the wafer 210 in the vertical (Z) direction. In some embodiments, the working distances 209A and 209B can be the same or different values depending on the lenses 205A and 205B on the on-valve inspection detectors 204A and 204B. In some embodiments, the on-valve inspection detector 204A moves with the vacuum valve door 202, while the on-valve inspection detector 204B is stationary fixed on the vacuum valve base 203. In some embodiments, diffused illumination from remotely located light sources (not shown) can be used in a connecting chamber 104, which can provide sufficient light on the front and back surfaces of the wafer 210 so that the on-valve inspection detectors 204 are able to capture high-resolution images. In some embodiments, additional mechanical control units (not shown) can be provided between the on-valve inspection detectors 204 and the vacuum valve door 202 or the vacuum valve base 203 for alignment purpose.

In some embodiments, an on-valve inspection detector 204 is a line scan camera. In some embodiments, instead of capturing an image of the entire wafer surface as a whole, the on-valve inspection detector 204 based on a line scan camera collects image data one scan line at a time. An image line 216A of the on-valve inspection detector 204A, indicated by a short dashed line in FIG. 2A, is a line region where the reflected or scattered light from the front surface of the wafer 210 is collected by a light sensor in the on-valve inspection detector 204A through the imaging lens 205A. In some embodiments, the field of view 218A of the on-valve inspection detector 204A in the Y direction, e.g., the maximum length of the image line 216A, can be adjusted by the width of the light sensor in the on-valve inspection detector 204A, the working distance 209A, and the focal length of the lens 205A. In some embodiments, the image line 216A is the overlap portion of the field of view 218A in Y direction and the front surface of the wafer 210. For example, the width of imaging lens can be 25 millimeters (mm), which can provide a field of view 218 with a width of up to 215 mm in the Y direction and a sensor width of 14 mm. Therefore, the resolution in the Y direction, which has a unit in mm per pixel for a light sensor width of 1024 pixels per line, can be controlled by the working distance 209 taking into account the diameter of the wafer 210. Similarly, an image line (not shown) of the on-valve inspection detector 204B can be configured on the back surface of the wafer 210.

In some embodiments, the light sensor of the on-valve inspection detector 204 can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, the light sensor can be configured to either work in a broad range of wavelengths or a narrow range of wavelengths. In some other embodiments, the light sensor can be configured to receive either reflected and/or scattered non-fluorescence light from a light source or a fluorescence light emitted by the defects or features due to an excitation by the light source.

In some embodiments, the wafer 210 can be a silicon substrate. Alternatively, the wafer 210 may include other elementary semiconductor material such as, for example, germanium. The substrate may also include a compound semiconductor material such as silicon carbide, gallium arsenide, indium arsenide, and indium phosphide. Furthermore, the wafer 210 may include an alloy semiconductor material such as silicon germanium, silicon germanium carbide, gallium arsenic phosphide, and gallium indium phosphide. Each material may interact differently with the incident light from the light source due to different material properties, e.g., refractive index and extinction coefficient, which can affect the design of the illumination source and the light sensor, e.g., wavelength, sensitivity and mode (e.g., scattered, reflected light or fluorescence light), as well as the speed of the transfer mechanism 208.

The wafer 210 may contain at least one feature to be optically inspected by the on-valve inspection detectors 204. In some embodiments, the wafer 210 may include trenches from dry/wet etching of a dielectric material including fluorinated silica glass (FSG), phosphosilicate glass (PSG), borophosphosilicate glass (BPSG), polyimide, and/or other future developed low-k dielectric materials. In some embodiments, the wafer 210 can also include conductive features such as, for example horizontal interconnect lines or vertical vias from processes like chemical vapor deposition (CVD), physical vapor deposition (PVD), spin-on coating and the like. In some embodiments, the design of the illumination source, light sensor, and imaging lens 205 can be also affected by the physical dimension of these layers of materials on the wafer 210, e.g., thickness and roughness, in combination with the material property of the wafer 210 and the materials on top, due to phenomena such as, for example interference effect and antireflection effect.

FIG. 2B illustrates a perspective view of a vacuum processing chamber 214 with six on-valve inspection detectors 204, in accordance with some embodiments of the present disclosure. When the diameter of a large wafer 210 is much greater than the field of view 218 of an on-valve inspection detector 204 under a desired resolution, a plurality of on-valve inspection detectors 204 can be used to scan one surface of the wafer 210. In the illustrated embodiment, 3 on-valve inspection detectors 204-1A, 204-2A and 204-3A are used to scan the front surface of the wafer 210 and 3 on-valve inspection detectors 204-1B, 204-2B, and 204-3B are used to scan the back surface of the wafer 210.

In another embodiment, an imaging lens 205 with a larger diameter, a smaller focal length, and/or a large refractive index can be used to provide a wide field of view 218 at a small working distance 209. To obtain a comparable resolution (mm per pixel) to that on a smaller wafer, an on-valve inspection detector 204 with a larger sensor size may be used.

In some other embodiments, since the optical pathway can be folded with a portion in the X direction parallel to the transfer direction of the wafer 210, reflective mirrors (not shown) can be also used to extend the field of views 209 in order to cover the entire wafer surfaces in applications where a large space in the Z direction is not available, e.g., the total height of a transfer chamber 214 is smaller than the summation of the working distances 209 and the length of the on-valve inspection detectors 204. The configuration presented in FIG. 2B is merely for illustration purpose and is not intended to be limiting. For example, any number of on-valve inspection detectors 204 at any position on the vacuum valve door 202 or the vacuum valve base 203 can be used to provide a full surface scan in order to completely construct the surface images considering the limitations from the field of view 218 and/or available spaces in the connecting chamber 104 and the vacuum processing chamber 214.

Although the above-illustrated systems in FIGS. 2A-2B comprises 2 and 6 on-valve inspection detectors 204, any desired number of on-valve inspection detectors 204 can be combined, e.g., working in different ranges of wavelength and simultaneously detect different defects (e.g., size, distribution, and materials), while remaining within the scope of the present disclosure.

In some embodiments, a uniform intensity from a flood light source illumination becomes difficult, when a large wafer 210 is inspected especially within a limited space. As mentioned above, since the image line 216 is the only portion of the wafer 210 that needs to be uniformly illuminated for collecting line-scan images by the on-valve inspection detector 204, the illumination to the image line 216 can be from a line light source having a narrow slit to direct a light beam. In some embodiments, the line light source can include an array of light emitting diodes (LEDs) with a half bar converging line lens as an optical guide. Such a light source may be configured in the limited space while maintaining a uniform illumination to the image line 216 on the wafer 210. In some embodiments, there are at least 2 line light sources for the front and back surfaces of the wafer 210. However, in accordance with various embodiments, various light sources suitable for various applications may be utilized.

In some embodiments, the relative position between the on-valve inspection detector 204 and the light source can affect the inspection criteria. For example, in case of using a linear light source on a wafer 210 with a reflective surface, when the on-valve inspection detector is off the angle of reflection, the reflective surface appears dark in the light sensor while the features and/or defects can scatter light and appear bright in the image. For another example, when the on-valve inspection detector 204 is within the angle of reflection of the incident light from the light source, the surface appears bright while the features and/or defects may appear darker or brighter depending on their reflectivity relative to the rest of the surface.

In some embodiments, the transfer mechanism 208 can be a robotic arm which consists of multiple joints, a single arm, and a stage. In some embodiments, the transfer mechanism 208 can provide high-speed and high-accuracy wafer handling within a limited space. As discussed above, a surface inspection using the on-valve inspection detector 204 requires a linear motion of the wafer 210 in a direction perpendicular to the axis of the image line 216. In some embodiments, the on-valve inspection detector 204 can be configured to focus on one portion of a wafer 210 transfer pathway where such linear relative motion between the wafer 210 and the image line 216 can be provided by a combination of moving parts of the transfer mechanism 208 (e.g., rotation of joints and linear motion of arm and the stage).

Figure 2C:
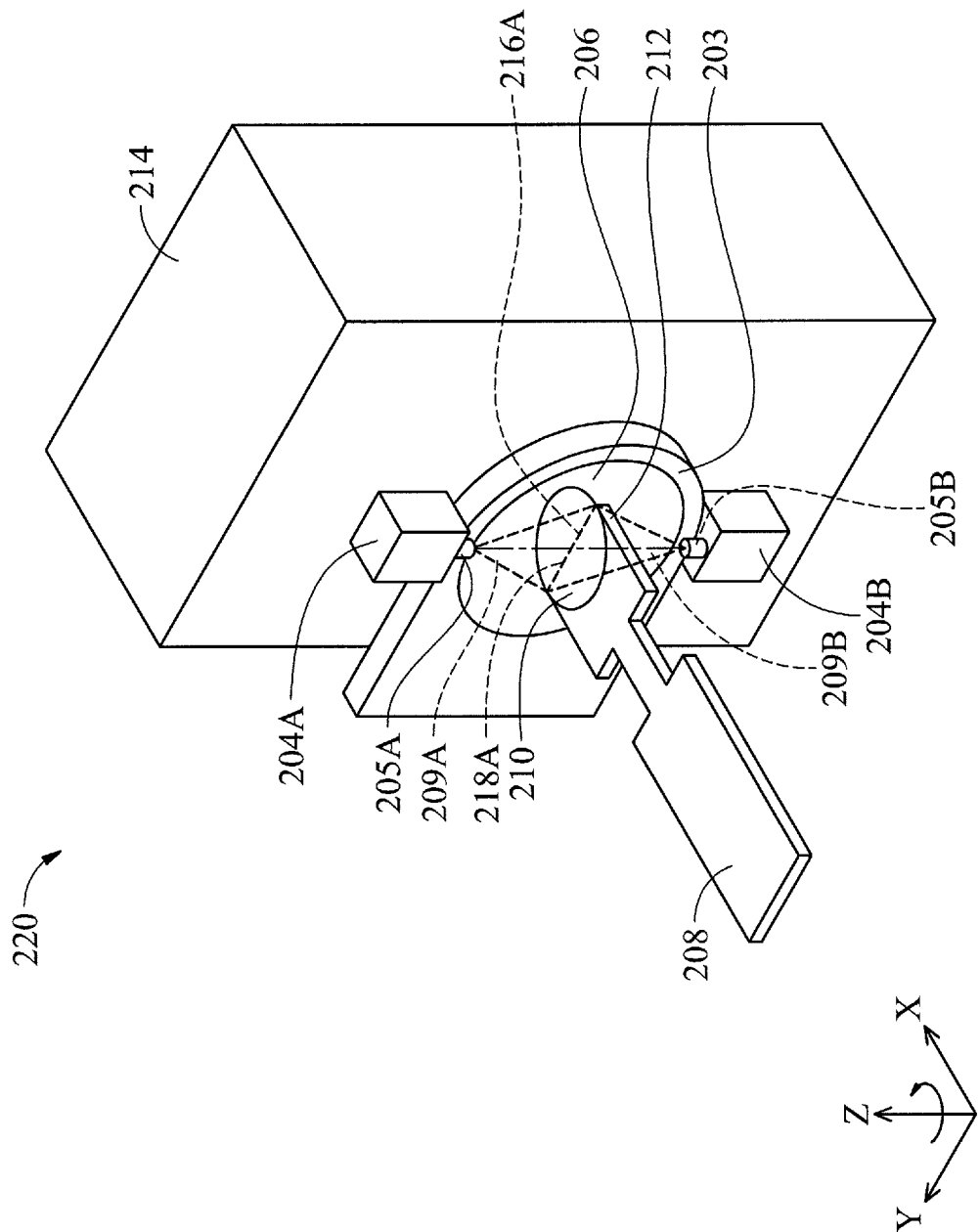
FIG. 2C illustrates a perspective view of a vacuum processing chamber with two on-valve inspection detectors, in accordance with some embodiments of the present disclosure.

FIG. 2C illustrates a perspective view of a vacuum processing chamber 214 with two on-valve inspection detectors 204, in accordance with some embodiments of the present disclosure. In some embodiments, both on-valve inspection detectors 204A and 204B can be both stationary on a vacuum valve frame 213 e.g., when the axis of the motion of the vacuum valve door 202 is not perpendicular to the wafer surfaces. In the illustrated embodiments, the vacuum valve door 202 is movable in the Y direction that is parallel to the surface of the semiconductor wafer 210. FIG. 2C is for illustration purposes and is not intend to be limiting. The vacuum valve door 202 is movable in any directions in the Y-Z plane and is within the scope of this present disclosure. For example, in some embodiments, the vacuum valve door 202 can be rotated in the Y-Z plane, which allows the vacuum valve door 202 to move in a direction that has an angle (i.e., in a range of 0 to 90 degrees) relative to the Y-direction.

Figure 3A:
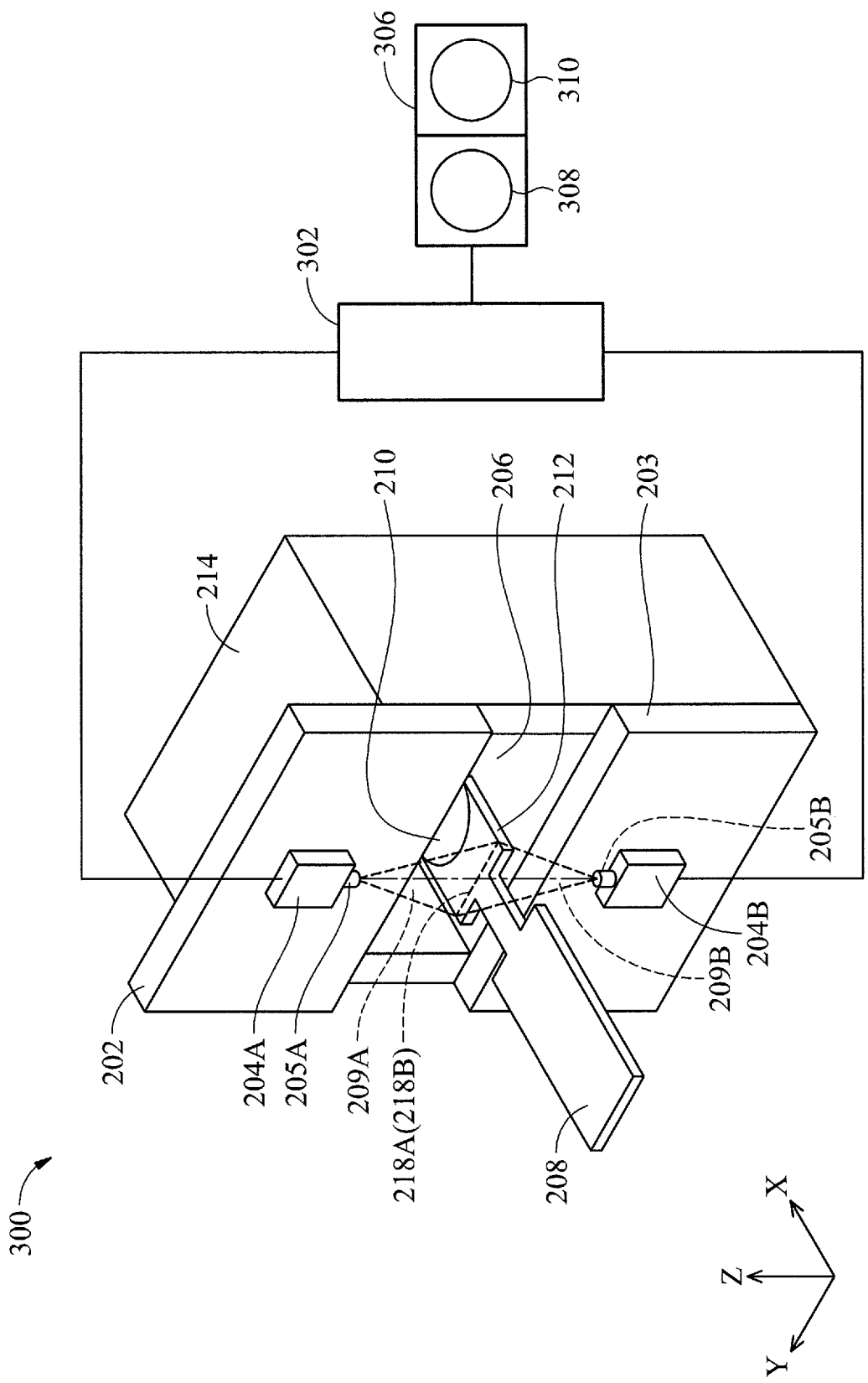
FIGS. 3A-3C illustrate perspective views of a system for scanning and recording a plurality of line images of a front and a back surfaces of a wafer using a plurality of on-valve inspection detectors while the wafer is being transferred by a transfer mechanism through a transfer port of a vacuum processing chamber, in accordance with some embodiments of the present disclosure.
Figure 3B:
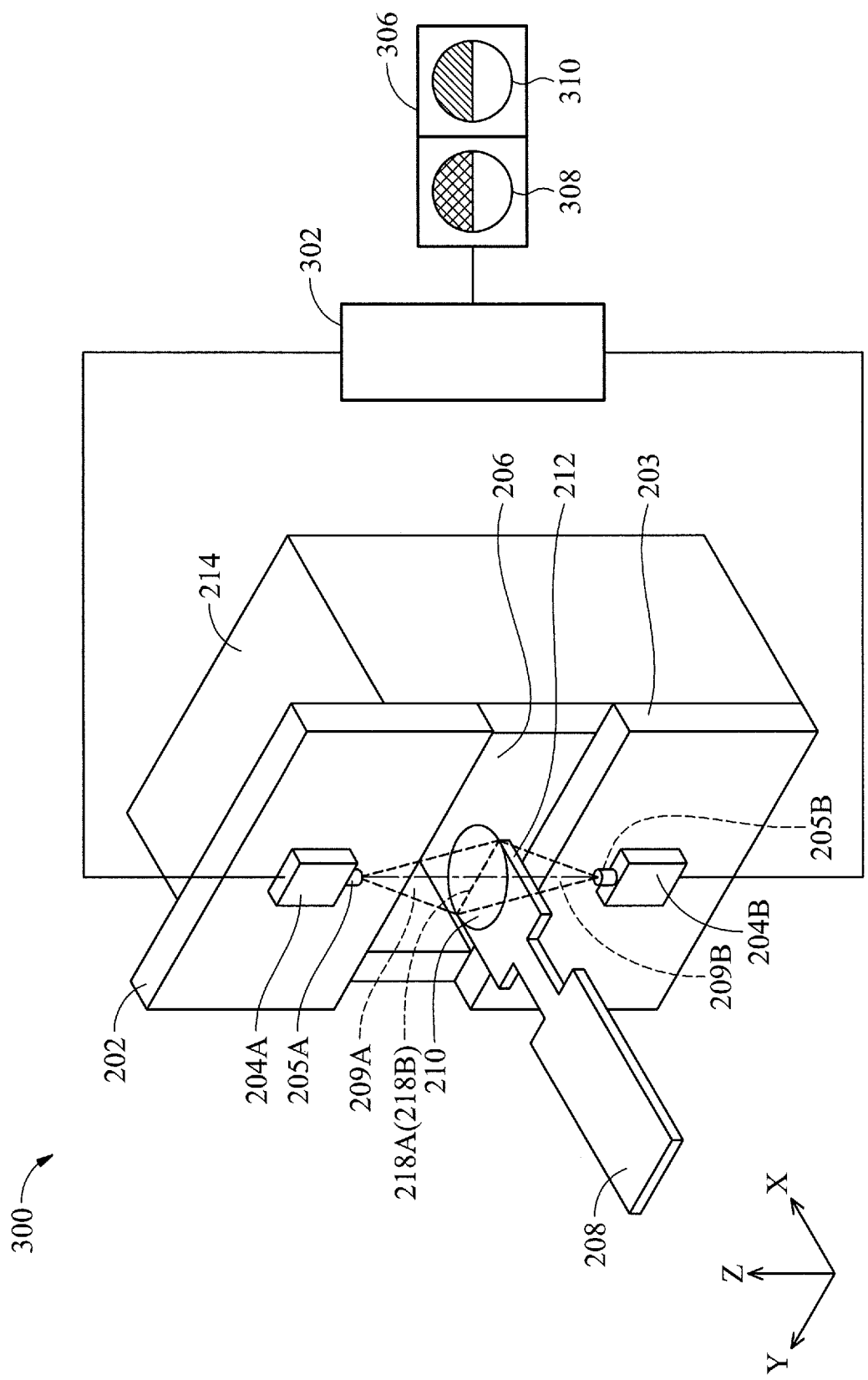
Figure 3C:
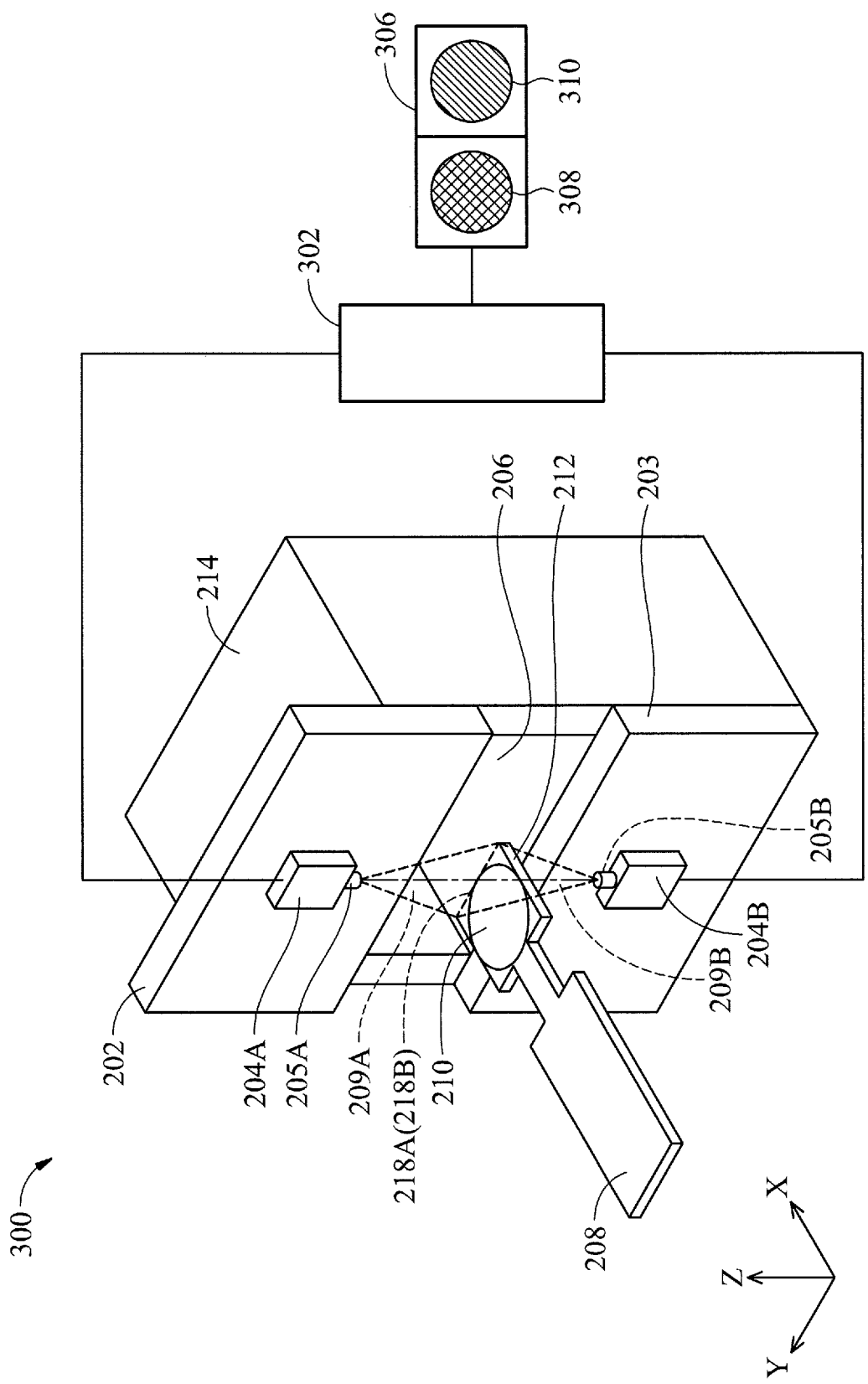

FIGS. 3A-3C illustrate perspective views of a system 300 for scanning and recording a plurality of line images of a front and a back surfaces of a wafer 210 using a plurality of on-valve inspection detectors while the wafer 210 is being transferred by a transfer mechanism 208 through a transfer port 206 of a vacuum processing chamber 214, in accordance with some embodiments of the present disclosure.

The system 300 first scans the wafer 210 at a first position of the wafer 210 on a wafer hold 212 controlled by the transfer mechanism 208 as shown in FIG. 3A. At the first position, the scan of the front and back surfaces is initiated, in accordance with some embodiments. As the wafer 210 enters the field of view 218A and 218B of the on-valve inspection detectors 204A and 204B, respectively, a recording cycle of a plurality of line images on both surfaces using the on-valve inspection detectors 204A and 204B is initiated. In some embodiments, the recording can be also initiated by a position signal from an encoder that is located on a motor of the transfer mechanism 208. In some embodiments, the plurality of line images collected from the front and back surfaces as the scanning progresses are shown on a display monitor 306 coupled to the local computer 302. In some embodiments, a window 308 on the display monitor 306 is for displaying the plurality of line images collected from the front surface by the on-valve inspection detector 204A and a window 310 on the display monitor 306 is for displaying the plurality of line images collected from the back surface by the on-valve inspection detector 204B. As shown in FIG. 3A, at the beginning of the scanning process, no line image is yet available for display in both windows 308/310 on the display monitor 306.

In some embodiments, such recording process of one line image from the on-valve inspection detector 204 to the local computer 302 is conducted in two steps, i.e., exposure and readout steps. In the first step, the on-valve inspection detector 204 collects a single line image per exposure at one position which is initiated by the application of a trigger pulse to the on-valve inspection detector 204, as discussed above. The trigger pulse also ends the exposure period and starts the second step of transferring the line image information to a readout register and finally out of the on-valve inspection detector 204 to the local computer 302, to complete the readout step. In some embodiments, the line images are provided to the local computer 302 one line of pixels at a time.

In some embodiments, the exposure time of an individual line at the image line 216 and the number of lines can be affected by the velocity of the wafer 210 and resolution requirement along the X axis in the wafer plane. In some embodiment, the exposure time may also be affected by illumination intensity, sensitivity of the light sensor, and type of defects being detected. In parallel with the first readout period, the on-valve inspection detector 204 continues with the next exposure step in a next cycle, while the transfer mechanism 208 moves the wafer 210 to the next position.

The system 300 continues to a second position in FIG. 3B where a partial scan of the front and back surfaces of the wafer 210 is completed, in accordance with some embodiments. In some embodiments, reconstruction of the surface images of the wafer 210 under inspection is conducted based on the plurality of line images received on the local computer 302 from the on-valve inspection detectors 204 and their corresponding positions on the wafer 210. The plurality of line images are then displayed in the corresponding windows 308/310 on the display monitor 306 in real time, as shown in FIG. 3B.

Once the surfaces of the wafer 210 under inspection has been completely scanned at a third position, as illustrated in FIG. 3C, the local computer 302 then proceeds to reconstruct and preprocess the complete two-dimensional surface images to prepare the surface images for defect detection. In some embodiments, such preprocessing of the surface images includes offset correction, gain correction, distortion correction, adjusting contrast, and the like. In accordance with some embodiments, the reconstructed surface images are then displayed in the corresponding windows 308/310 on the display monitor 306, as shown in FIG. 3C.

Figure 4:
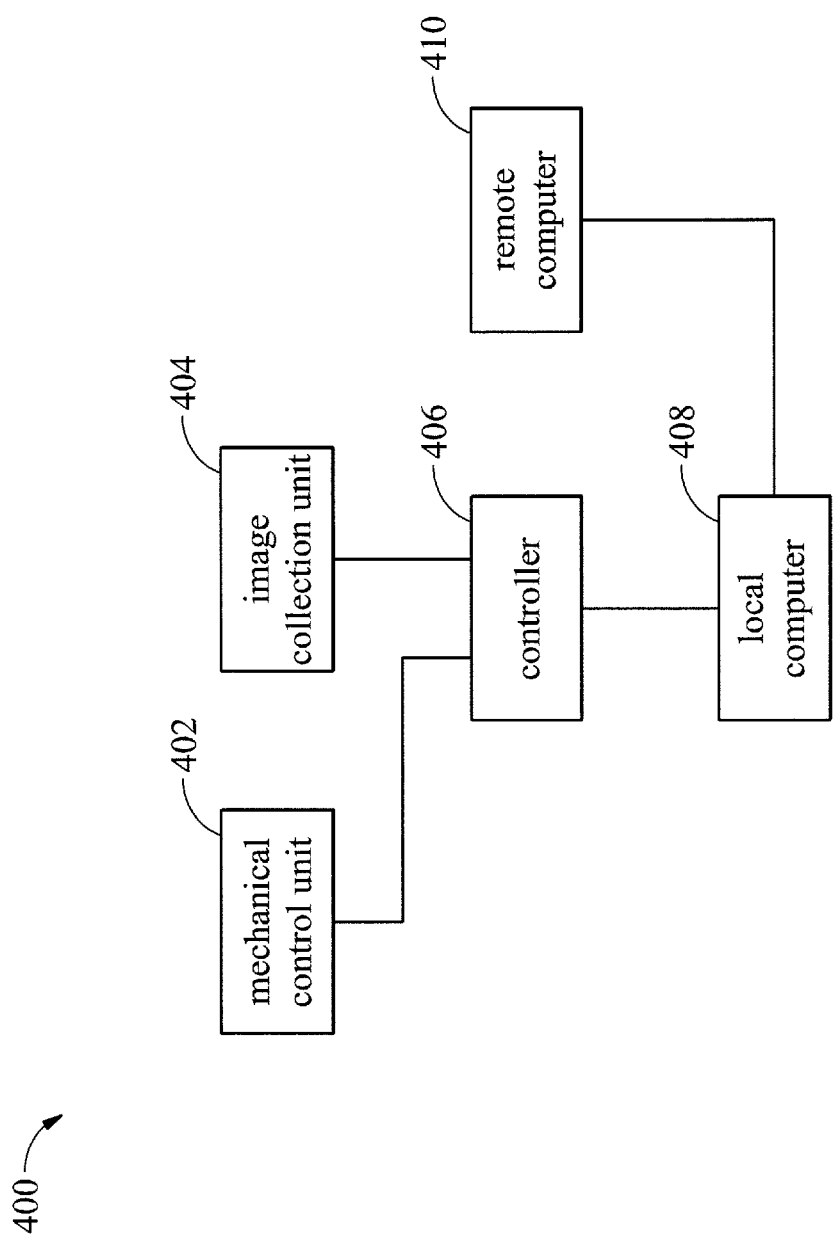
FIG. 4 illustrates a block diagram of a system with on-valve inspection detectors for inspecting wafer surfaces, in accordance with some embodiments of the present disclosure.

FIG. 4 illustrates a block diagram of a system 400 with on-valve inspection detectors 204 for inspecting wafer surfaces, in accordance with some embodiments of the present disclosure. The system 400 comprises a mechanical control unit 402, an image collection unit 404, a controller 406, a local computer 408, and a remote computer 410. The mechanical control unit 402 directly interfaces with a transfer mechanism 208 (e.g., robotic transfer arm) to transfer a semiconductor wafer 210 into and out of a vacuum processing chamber 214, in some embodiments. In some embodiments, the wafer 210 can be transferred using other transfer mechanisms 208 such as a belt conveyor, and the like, which can provide motions such as, for example horizontal, vertical, linear, rotation, and a combination thereof. In some embodiments, the transfer mechanism 208 can handle a variety of substrates such as, for example, thin, large, film frame, glass, grooved, or the like. In some embodiments, the transfer mechanism may transfer wafers between cassettes, stages and/or chambers. In some embodiments, a mechanical control unit 402 communicates with encoders on the transfer mechanism 208 and sends trigger signals to the on-valve inspection detectors 204 connected to the image collection unit 404 through a controller 406. The mechanical control unit 402 further controls the opening and closing motion of the vacuum valve door 202 attached to the transfer port 206 of the vacuum processing chamber 214, according to some embodiments. Furthermore, the mechanical control unit 402 also provides control to mechanisms attached to the on-valve inspection detectors 204 which are used for alignment and focusing purposes.

In some embodiments, the image collection unit 404 comprises a plurality of on-valve inspection detectors 204. In some embodiments, the plurality of on-valve inspection detectors 204 each includes a light sensor that can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, the light sensor can be configured to either work in a broad range of wavelengths or a narrow range of wavelengths. In some other embodiments, the light sensor can be configured to receive either reflected and/or scattered non-fluorescence light from a light source or a fluorescence light emitted by the defects or features due to an excitation by the light source.

In some embodiments, the controller 406 is a representative device and may comprise a processor, a memory, an input/output interface, a communications interface, and a system bus. The processor may comprise any processing circuitry operative to control the operations and performance of the controller 406 of the system 400. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the controller 406 of the system 400.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C #, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the controller 406 of the system 400 and the controller 406 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the controller 406 of the system 400. As another example, the visual peripheral output device may comprise a movable display or projecting system for providing a display of content on a surface remote from the controller 406 of the system 400. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the controller 406 of the system 400, information regarding ongoing communications operations, information regarding incoming communications requests, or device operation screens, to name only a few.

In some embodiments, the communications interface may comprise any suitable hardware, software, or combination of hardware and software that is capable of coupling the controller 406 of the system 400 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the controller 406 of the system 400 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

In some embodiments, the local computer 408 configures inspection parameters to the image collection unit 404 and the mechanical control unit 402 through the controller 406. These inspection parameters are configured for a particular type of substrate, feature, or defect to be inspected. In some embodiment, this configuration process includes writing an inspection recipe or recalling an existing recipe. In some embodiments, inspection parameters include trigger criteria, inspection resolution, line frequency, pixel frequency, total acquisition time, illumination intensity, moving speed of transfer mechanism, size of wafer, and/or other suitable parameters. In some embodiments, the local computer 408 is also configured to reconstruct and preprocess the complete two-dimensional surface images from a plurality of line images to prepare the surface images for defect detection. In some embodiments, such preprocessing of the surface images includes offset correction, gain correction, distortion correction, adjusting contrast, and the like. In some embodiments, the local computer 408 comprises a display monitor 306 to display real-time line images and constructed surface images of the wafer 210. In some embodiments, the display monitor 306 can be also a touch screen for inputting and displaying inspection parameters.

In some embodiments, the remote computer 410 is configured to analyze preprocessed surface images from the local computer 408. The image analysis process comprises a characterization of the size and distribution of defects, and are compared with the design criteria of the device, such as size, shape, location and color to classify the defects into pre-defined categories. In some embodiments, the design criteria can vary between various steps within the production line with different layout characteristics.

Figure 5:
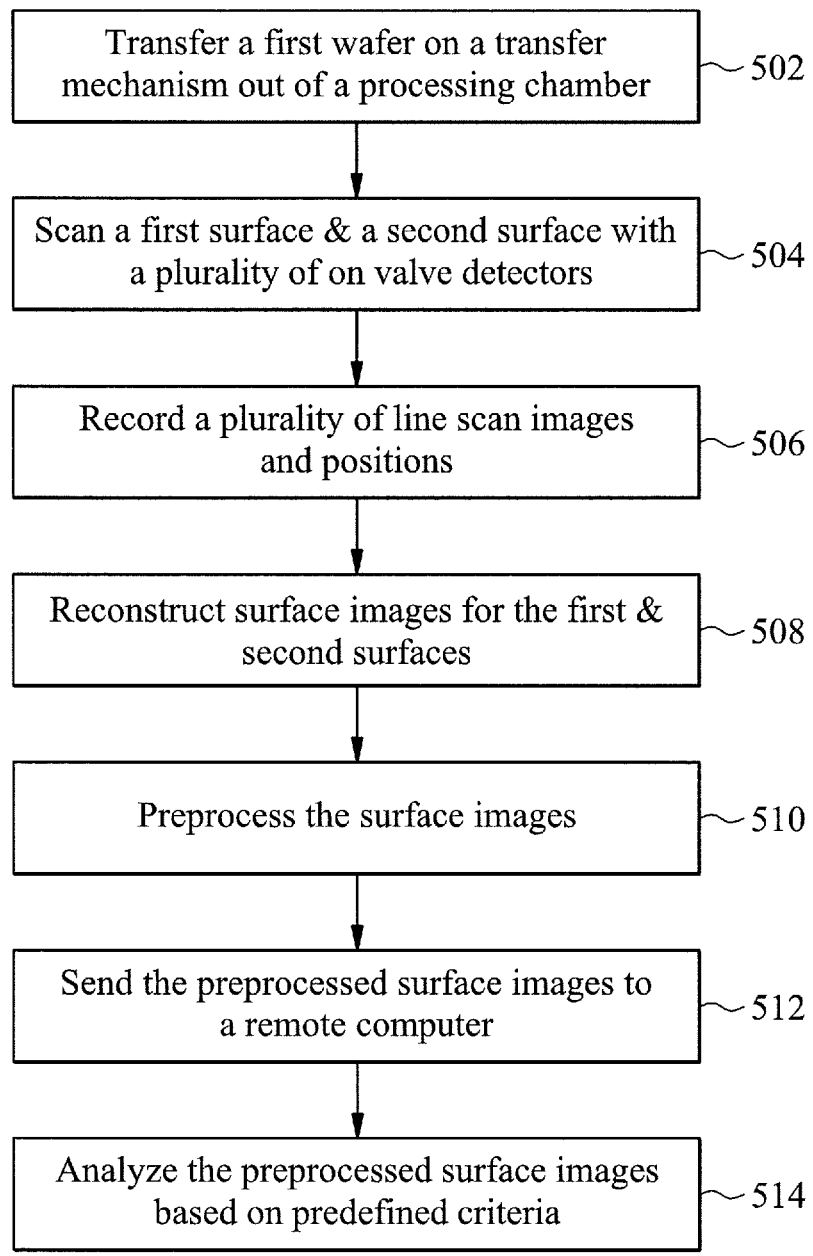
FIG. 5 illustrates a flowchart of a method for inspecting wafer surfaces using on-valve inspection detectors, in accordance with some embodiments of the present disclosure.

FIG. 5 illustrates a flowchart of a method 500 for inspecting wafer surfaces using on-valve inspection detectors 204, in accordance with some embodiments of the present disclosure. It is understood that additional operations may be provided before, during, and after the method 500 of FIG. 5, and that some other operations may be omitted or only briefly described herein.

The method 500 starts at operation 502 in which a wafer 210 is transferred on a transfer mechanism 208 out of a processing chamber 214, according to some embodiments. The method 500 continues to operation 504 in which a front and a back surfaces of the wafer 210 are scanned using a plurality of on-valve inspection detectors 204 on a vacuum valve 202/203 of the processing chamber 214, while being transported by the transfer mechanism 208 at a constant speed along a direction perpendicular to the line scan direction through a transfer port 206, as discussed above with respect to FIGS. 2 and 3, for example. In some embodiments, operation 504 also includes configuration of the inspection parameters, e.g., resolution and line scan speed. In some embodiments, operation 504 further includes configuration of the mechanical control unit 402 which controls the motion of the transfer mechanism 208, e.g., speed and direction. In some embodiments, the line scanning can be triggered by the controller 406 which acquires position parameters from the encoder located on the transfer mechanism 208. In some embodiments, the line speed of the on-valve inspection detectors 204 is determined by the speed of the transfer mechanism 208. In another embodiment, the resolution requirement of the on-valve inspection detectors 204 can be determined by the type of defects that are interested or are potentially introduced in a respective step of the manufacturing production line.

The method 500 continues to operation 506 in which a plurality of line images from each of the plurality of on-valve inspection detectors 204 and their position information on the front and back surfaces of the wafer 210 are recorded, according to some embodiments. In some embodiments, the plurality of line images from each of the plurality of on-valve inspection detectors 204 is converted from analog signals to digital signals and stored in a local computer 408.

The method 500 continues with operation 508 in which surface images are reconstructed based on the plurality of line images from each of the plurality of on-valve inspection detectors 204 once a scanning of both surfaces of the wafer 210 is completed.

The method 500 continues with operation 510 in which the reconstructed surface images of both surfaces of the wafer are preprocessed. In some embodiments, the reconstruction and preprocessing of surface images include at least one of the processes such as, for example, offset correction, gain correction, distortion correction, adjusting contrast, and the like.

The method 500 continues to operation 512 in which the preprocessed surface images of both surfaces of the wafer 210 are transmitted to a remote computer 410, according to some embodiments. In some embodiments, operation 512 also includes displaying the preprocessed surface images of both surfaces on a local display monitor which is coupled to a local computer 408.

The method 500 continues with operation 514 in which the preprocessed surface images of both front and back surfaces of the wafer 210 are analyzed by the remote computer 410, according to some embodiments. In some embodiments, the analysis of the preprocessed surface images includes comparing to references, design criteria and predefined threshold to conduct a wafer-scale mapping of defects by the remote computer 410 so as to determine the detect type and distribution. In some embodiments, results are then transmitted back to the local computer 408 to command the mechanical control unit 402 to control the transfer mechanism 208 so that the wafer 210 can be reprocessed, rejected or move on to a next process followed by unloading of a next wafer from the processing chamber 214 through the transfer port 206 for surface inspection. In some embodiment, the remote computer 410 may first identify the boundary of each die. In some embodiment, sensitivity of the system can be adjusted by the resolution of the on-valve inspection detectors 204. In some embodiments, the remote computer 410 can also decide to reject, reprocess or move on the wafer 210 based on the design criteria associated with the process information.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative twits such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

In some exemplary embodiments, a method for wafer-level inspection includes: transporting a semiconductor wafer through a transfer port of a processing chamber; scanning a surface of the semiconductor wafer automatically using at least one on-valve inspection detector arranged on a vacuum valve providing access through the transfer port; generating at least one surface image of the surface of the semiconductor wafer; and analyzing the at least one surface image to detect defects on the surface of the semiconductor wafer.

In other embodiments, a wafer-level inspection system includes: a transfer mechanism configured to automatically transfer a semiconductor wafer through a transfer port of a processing chamber; at least one on-valve inspection detector arranged on a vacuum valve, providing access through the transfer port of the processing chamber, wherein the at least one on-valve inspection detector is configured to scan a surface of the semiconductor wafer and generates a plurality of line images; and at least one processor configured to detect defects on the surface according to a set of predefined criteria.

In further embodiments, a wafer-level inspection system includes: a processing chamber for performing a semiconductor manufacturing process; a vacuum valve for providing access through a transfer port of the processing chamber; a transfer mechanism configured to automatically transport a semiconductor wafer through the transfer port of the processing chamber; at least one on-valve inspection detector arranged on the vacuum valve to scan a surface of the semiconductor wafer; and at least one processor configured to detect defects on the surface of the semiconductor wafer according to a set of predefined criteria.

What is claimed is:

1. A method for wafer-level inspection comprising:
   transporting a semiconductor wafer through a transfer port of a semiconductor processing chamber comprising a vacuum valve having a movable valve door and a valve base configured to open with respect to each other to provide the transfer port and close with respect to each other to seal the semiconductor processing chamber;
   scanning a first surface of the semiconductor wafer automatically using a first inspection detector fixed to an outside surface of the movable valve door as the semiconductor wafer is transported through the transfer port;
   scanning a second surface of the semiconductor wafer automatically using a second inspection detector fixed to an outside surface of the valve base as the semiconductor waver is transported through the transfer port, wherein the second surface is opposite the first surface;
   generating at least one first surface image of the first surface of the semiconductor wafer and at least one second surface image of the second surface of the semiconductor wafer; and
   analyzing the at least one first and second surface images to detect defects on the first and second surfaces of the semiconductor wafer.

2. The method of claim 1, wherein the transporting comprises using a transfer mechanism to transport the semiconductor wafer through the transfer port of the processing chamber.

3. The method of claim 2, wherein the transfer mechanism is coupled to a wafer holder for holding the semiconductor wafer and exposing the surface of the semiconductor wafer.

4. The method of claim 1, wherein the first and second inspection detectors each comprises a line scan camera.

5. The method of claim 1, wherein the first and second inspection detectors are each configured to scan the first and second surfaces of the semiconductor wafer, respectively, one pixel line at a time.

6. The method of claim 1, wherein the generating the at least one first and second surface images further comprises:

transmitting a plurality of line images from the first and second inspection detectors to a local computer; and
preprocessing the plurality of line images by the local computer to generate the at least one first and second surface images.

7. The method of claim 1, further comprising:
transmitting the at least one first and second surface images to a remote computer;
analyzing the at least one first and second surface images by the remote computer; and
comparing the at least one first and second surface images to a set of predefined criteria to detect defects on the first and second surfaces of the semiconductor wafer.

8. A wafer-level inspection system comprising:
a transfer mechanism configured to automatically transfer a semiconductor wafer through a transfer port of a semiconductor processing chamber, wherein the processing chamber comprises a vacuum valve having a movable valve door and a valve base configured to open with respect to each other to provide the transfer port and close with respect to each other to seal the semiconductor processing chamber;
at least one first inspection detector fixed to a surface of the valve door, wherein the at least one first inspection detector is configured to scan a first surface of the semiconductor wafer as the semiconductor wafer is transported through the transfer port, and wherein the at least one first inspection detector generates a plurality of first line images;
at least one second inspection detector fixed to a surface of the valve base, wherein the at least one second inspection detector is configured to scan a second surface of the semiconductor wafer as the semiconductor wafer is transported through the transfer port, wherein the second surface is opposite the first surface, and wherein the at least one second inspection detector generates a plurality of second line images; and
at least one processor configured to detect defects on the first and second surfaces of the semiconductor wafer according to a set of predefined criteria.

9. The system of claim 8, wherein the transfer mechanism comprises a robotic transfer arm.

10. The system of claim 8, wherein the transfer mechanism is coupled to a wafer holder for holding the semiconductor wafer and exposing the first and second surfaces of the semiconductor wafer.

11. The system of claim 8, wherein the at least one first and second inspection detectors each comprises a line, scan camera.

12. The system of claim 8, wherein the at least one first and second inspection detectors are each configured to scan the first and second surfaces of the semiconductor wafer, respectively, one pixel line at a time.

13. The system of claim 8, wherein the at least one processor comprises a local computer configured to:
receive the plurality of first and second line images from the at least one first and second inspection detectors, respectively; and
preprocess the plurality of first and second line images to generate at least one first and second surface image, respectively, for the first and second surfaces of the semiconductor wafer.

14. The system of claim 13, wherein the at least one processor further comprises a remote computer configured to:
receive the at least one first and second surface images from the local computer;
analyze the at least one first and second surface images; and
compare the at least one first and second surface images to the set of predefined criteria to detect defects on the first and second surfaces of the semiconductor wafer.

15. A wafer-level inspection system comprising:
a processing chamber for performing a semiconductor manufacturing process, the processing chamber comprising a vacuum valve having a movable valve door and a valve base configured to open with respect to each other to provide the transfer port and close with respect to each other to seal the semiconductor processing chamber;
a transfer mechanism configured to automatically transport a semiconductor wafer through the transfer port of the processing chamber when the movable valve door and a valve base are open with respect to each other;
at least one first inspection detector fixed to a surface of the valve door, wherein the at least one first inspection detector is configured to scan a first surface of the semiconductor wafer as the semiconductor wafer is transported through the transfer port, and wherein the at least one first inspection detector generates a plurality of first line images;
at least one second inspection detector fixed to a surface of the valve base, wherein the at least one second inspection detector is configured to scan a second surface of the semiconductor wafer as the semiconductor wafer is transported through the transfer port, wherein the second surface is opposite the first surface, and wherein the at least one second inspection detector generates a plurality of second line images; and
at least one processor configured to detect defects on the first and second surfaces of the semiconductor wafer according to a set of predefined criteria.

16. The system of claim 15, wherein the at least one first and second inspection detectors each comprises a line scan camera.

17. The system of claim 15, wherein the at least one first and second inspection detectors are each configured to scan the first and second surfaces of the semiconductor wafer, respectively, one pixel line at a time.

18. The system of claim 15, wherein the transfer mechanism is coupled to a wafer holder for holding the semiconductor wafer and exposing the first and second surfaces of the semiconductor wafer.

19. The system of claim 15, wherein the at least one processor comprises a local computer configured to:
receive the plurality of first and second line images from the at least one first and second inspection detectors, respectively; and
preprocess the plurality of first and second line images to generate at least one first and second surface image, respectively.

20. The system of claim 19, wherein the at least one processor further comprises a remote computer configured to:
receive the at least one first and second surface images from the local computer;
analyze the at least one first and second surface images; and
compare the at least one first and second surface images to the set of predefined criteria to detect defects on the first and second surfaces of the semiconductor wafer.

* * * * *